(12) United States Patent
Ahmad et al.

(10) Patent No.: US 6,203,926 B1
(45) Date of Patent: Mar. 20, 2001

(54) CORROSION-FREE MULTI-LAYER CONDUCTOR

(75) Inventors: Umar Moez Uddin Ahmad; Harsaran Singh Bhatia, both of Hopewell Junction; Satya Pal Singh Bhatia, Wappingers Falls; Hormazdyar Minocher Dalal, Milton; William Henry Price, Courtland Manor; Sampath Purushothaman, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/473,142

(22) Filed: Dec. 28, 1999

Related U.S. Application Data

(60) Continuation of application No. 08/304,961, filed on Sep. 12, 1994, now abandoned, which is a division of application No. 07/997,827, filed on Dec. 29, 1992, now Pat. No. 5,427,983.

(51) Int. Cl.7 .............................. H01L 29/12; B32B 15/04
(52) U.S. Cl. .......................... 428/620; 428/673; 428/671; 428/670; 428/674; 428/675; 428/651; 428/652; 428/662; 428/660; 428/668
(58) Field of Search ..................................... 428/620, 673, 428/671, 670, 674, 675, 651, 652, 662, 660, 668; 427/99, 250

(56) References Cited

U.S. PATENT DOCUMENTS

| | | | |
|---|---|---|---|
| 4,077,854 | 3/1978 | Estep et al. | 205/159 |
| 4,396,900 | 8/1983 | Hall | 338/309 |
| 4,463,059 | 7/1984 | Bhattacharya et al. | 428/620 |
| 4,465,742 | 8/1984 | Nagashima et al. | 428/621 |
| 4,626,479 | 12/1986 | Hosoi et al. | 428/663 |
| 4,830,723 | 5/1989 | Galvagni et al. | 204/192.7 |
| 4,835,593 | 5/1989 | Arnold et al. | 174/52.4 |

FOREIGN PATENT DOCUMENTS

| | | |
|---|---|---|
| 2546871 | 4/1977 | (DE) . |
| 3029277 | 3/1982 | (DE) . |
| 0054641 | 10/1981 | (EP) . |
| 0215557 | 7/1986 | (EP) . |
| 8101079 | 4/1981 | (WO) . |

*Primary Examiner*—Linda L. Gray
(74) *Attorney, Agent, or Firm*—McGuireWoods, LLP; Aziz M. Ahsan, Esq.

(57) ABSTRACT

A corrosion resistant, multi-layer structure on a substrate including an adhesion metallic layer on the substrate, a cushion metallic layer on the adhesion layer, a diffusion barrier layer on the cushion layer, and an impermeable gold layer that encapsulates all the layers, is substantially even on all sides of the layers, and contacts a region on the substrate adjacent the layers to prevent oxidation and corrosion.

14 Claims, 3 Drawing Sheets

CORROSION-FREE MULTI-LAYER CONDUCTOR

CROSS-REFERENCE TO RELATED APPLICATION

This application is a continuation of U.S. patent application Ser. No. 08/304,961, filed Sep. 12, 1994, now abandoned which is a division of U.S. patent application Ser. No. 07/997,827, filed Dec. 29, 1992, now U.S. Pat. No. 5,427,983, issued Jun. 27, 1995.

BACKGROUND OF THE INVENTION

1. Field of the Invention

The present invention relates to an improved method for forming a multi-layer, thin-film, metallic structures; more particularly to a structure that resists failure due to corrosion.

2. Description of the Prior Art

In the micro-electronics art, multi-layered, thin-film, metallic structures carry electrical signal and electrical power in a variety of applications, including but not limited to, attaching input/output pins to multi-layer ceramic modules in order to connect these pins to capture pads on the surface of the module. Corrosion is a problem with such multi-layer thin-film conductive structures particularly those structures that include copper. When such a multi-layer metal structure, even one insulated or separated by polyimides, is left exposed to the atmosphere, copper starts to diffuse. It will diffuse into a polyimide or other insulator where the copper reacts to form various oxides, and dendrites tend to grow in the insulator. These dendrites ultimately short out and corrosion occurs.

FIG. 1a illustrates one example of a prior art multi-layer structure of Cr/Cu/Ti/Au on a ceramic or a glass ceramic substrate. Here, copper from the conductive line and the pad react with a polyimide insulator and short out in the insulator by a dendritic corrosion mechanism. This takes place because gold, which is the top layer does not offer any protection to the layers underneath as it does not flow over the underlying metal deposits. Other multi-layer conductors exhibit similar corrosion characteristics. These include multi-layer structures of Cr—Cu—Ni—Au and Cr—Cu—Al—Au.

FIGS. 1b and 1c illustrate another prior art multi-layered thin-film structure of the type to which the teachings of this invention apply. Here, a capture pad 10 is formed by a suitable prior process on the surface of a multi-layer, ceramic module substrate 12. The capture pad 10 is itself a multi-layer metallic structure comprised of layers of chromium-copper-chromium.

After the capture pads are formed, a cushion layer of an insulating polymer, 12', typically a polyimide, is applied and cured over the entire area. Openings are then created in this polymer layer using a laser ablation process or a plasma or reactive ion etching process to expose contact bands on the capture pads. The purpose of the polymer layer is two fold. First, it is used to isolate the pin attachment stresses from the ceramic substrate, and second, it serves as a passivation coating to protect the capture pads.

At this juncture, the thin-film metallic bonding pad structure starts with a thin adhesion layer 11 of a suitable metal such as chromium. A relatively thick (e.g., approximately 6 $\mu$m) stress reducing layer 13 of a soft metal such as copper is formed over the adhesion layer. To prevent the soft copper metal from reacting with a gold-tin eutectic alloy to be used subsequently to braze a pin to the structure, a reaction barrier layer 15 of titanium is then deposited over the stress reducing copper layer. The prior art process is completed by depositing a gold layer 17 over the reaction barrier layer. FIG. 1b illustrates this prior art structure prior to pin brazing. Here, it should be noted that the upper gold layer does not flow over the edge of the chromium, copper, titanium layers so that the edges of these layers are exposed. FIG. 1c indicates the structure of FIG. 1b generally by the reference number 18. In FIG. 1c a conductive pin 14 has been brazed to the structure 18 with a gold-tin braze. Here it should be noted that the brazing material 20 does not wet, and therefore, does not cover the edge of the Cr—Cu—Ti—Au structure 18.

Additional information with respect to prior art structures of the type shown in FIGS. 1b and 1c may be found in U.S. Pat. No. 4,835,593 entitled "Multilayer Thin Film Metallurgy for Pin Brazing", assigned to the assignee of this application and incorporated herein by reference.

While generally satisfactory, the prior art structures of the type described in connection with FIG. 1 are susceptible to corrosion and eventual failure during operation. One prior art approach to prevent corrosion is to coat the entire substrate surface with a polyimide coating. While generally satisfactory, the polyimide coating can randomly coat the contact surfaces, resulting in an insulated contact.

SUMMARY OF THE INVENTION

An object of this invention is the provision of an improved method for forming a multi-layer conductive structure of the types described in connection with FIG. 1; a method that results in a structure that resists corrosion and eliminates the need for a polyimide or other similar corrosion resistant overcoating.

Briefly, this invention contemplates a process for forming a thin-film metallization pad structure of the type described in which the final gold layer is deposited by evaporation with the surface onto which it is evaporated maintained at an elevated temperature. As previously mentioned, applicants have identified that the problem of corrosion in the prior art structures takes place at the exposed edges. evaporating the uppermost gold layer of the structure onto a substrate maintained at an elevated temperature, the gold atoms during deposition have a high mobility, causing the deposited gold to spread over the edge of the structure and cover the otherwise exposed edges. When, for example, a pin is brazed to the multi-layer structure, the gold-tin brazing material flows wherever the gold has spread, thereby providing an additional covering.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 2A:
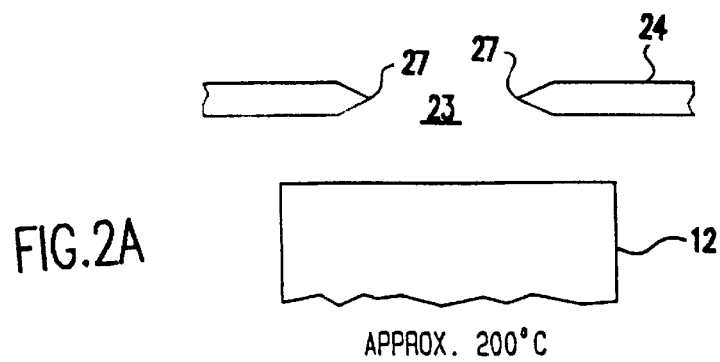
FIGS. 2a through 2d illustrate the steps of one embodiment of a process for forming a thin-film, multi-layer structure in accordance with the teachings of this invention.

Referring now to FIG. 2a, in one specific embodiment of the invention, a thin-film metallization pad structure in accordance with the invention is deposited onto a substrate through opening 23 on a metal mask 24. The substrate 12, in this example, is a ceramic or glass-ceramic substrate. In this particular example, a molybdenum mask 24 is used with an opening 23 formed by electroetching, preferably a two-sided etch to form knife-shaped edges 27, as this enhances the spreading of the metal being evaporated. The mask and the substrate 12 are aligned and held in place by a suitable fixture (not shown).

It will be appreciated that there is a mismatch in the thermal coefficients of expansion between the metal mask 24 and the substrate 12. The optimum temperature range of the substrate to deposit a gold layer in order to achieve the desired spreading in accordance with this invention is between 130° C. and 200° C. To reduce the effects of the thermal coefficient mismatch between the mask and the substrate, the process steps other than the gold deposit step are carried out at relatively low substrate temperatures, i.e., between 80° C. and 150° C. It should be noted that the spreading of the gold layer can be enhanced by a combination of the relatively higher substrate temperature, the metal mask, and the knife edges.

The assembly of mask 24 and substrate 12 are placed in an appropriate evaporation system (not shown) which is pumped down to about $10^{-6}$ torr and heated to about 200° centigrade for 15 to 30 minutes in order to outgas the assembly. The surface exposed through the mask is then cleaned in situ using argon to ensure removal of all absorbed contaminants from the ceramic areas exposed through the mask. A radio frequency, argon plasma at 1 to 5 m torr or alternatively argon ions from a broad beam ion source are each satisfactory processes for this cleaning step. FIG. 2a illustrates the assembly at the completion of these steps in the process.

Figure 2B:
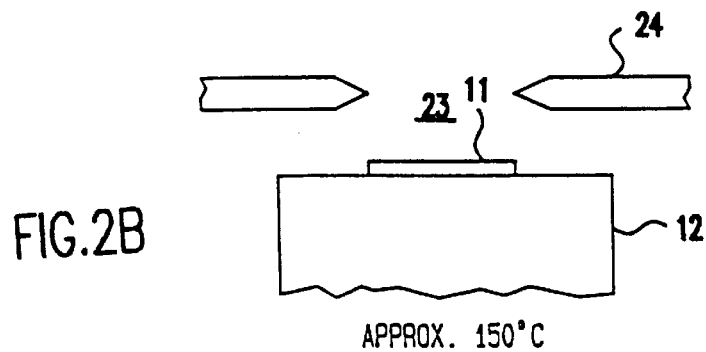

The substrate is then heated to 150° centigrade and an adhesion layer such as 200 Å layer 11 of chromium is deposited by evaporation of chromium onto the surface of the substrate exposed through the opening 23 in the mask. The substrate temperature is maintained at about 150° C. throughout this process step in order to form a chromium film with good adhesion of the film to the substrate surface and a low stress between the film and the surface. FIG. 2b shows the process at this step.

Figure 2C:
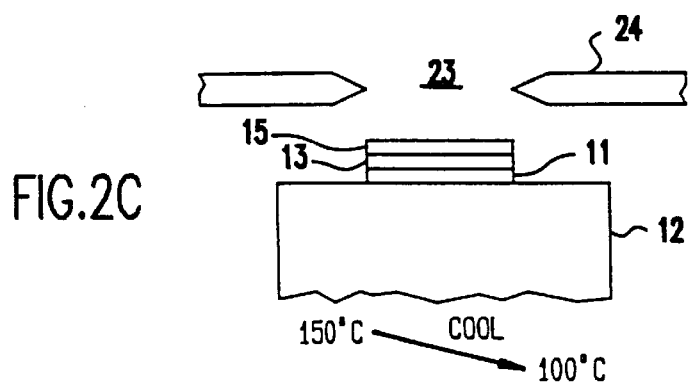
Figure 2D:
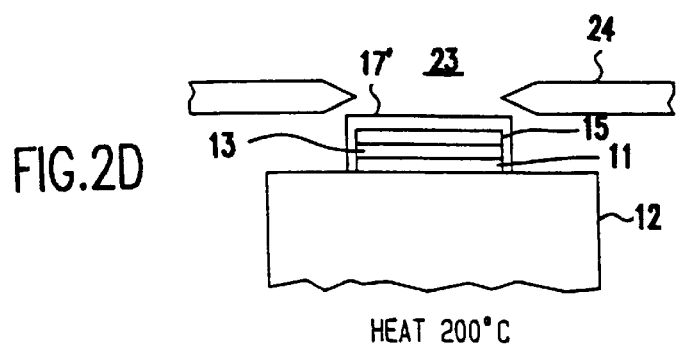

Next, a cushion layer such as copper and a diffusion barrier layer such as titanium are deposited sequentially by a suitable prior art evaporative process through the opening 23 in the mask 24 as the substrate cools from an initial temperature of the proceeding step (150° centigrade) to about 100° centigrade. The copper layer 13 is about 60 kÅ thick and the titanium layer 15 is about 10 kÅ thick. FIG. 2c shows the assembly at this process step.

After the deposition of the copper and titanium layers 13 and 15 respectively, the substrate is reheated to 200° centigrade and a gold layer 17' about 10 kÅ thick is deposited by evaporation through the opening 23 in the mask 24 onto the previously deposited layers. The heat is then turned off and the assembly allowed to cool to 50° centigrade or less, followed by venting of the chamber with dry nitrogen to atmospheric pressure to allow unloading of the assembly from the chamber.

Figure 3:
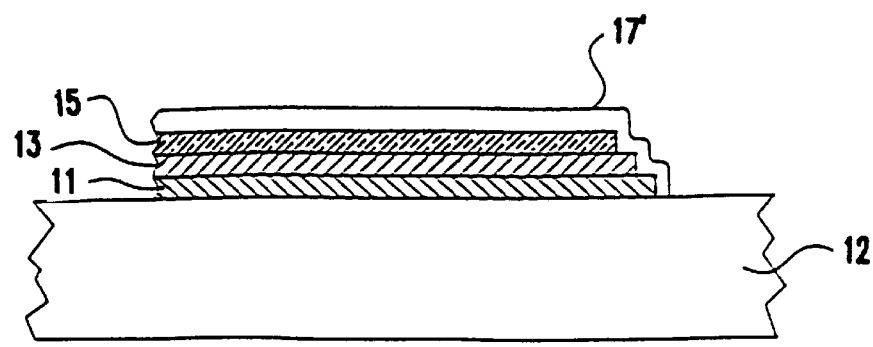
FIG. 3 is a sectional views of thin-film structures constructed in accordance with the teachings of this invention.

FIG. 3 shows the completed structure. Depositing the gold layer at an elevated substrate temperature increases the mobility of the gold atoms which diffuse down over the edges of the previously formed layers, so that the gold layer 17' encapsulates the underlying multi-layer structure. as illustrated in FIG. 3. This gold covering 17' prevents oxidation and diffusion of copper and thus prevents corrosion.

The third metallic diffusion barrier layer 15 is a metal selected from a group consisting of Titanium (Ti), Nickel (Ni), Cobalt (Co), Platinum (Pt) or Palladium (Pd).

Figure 1A:
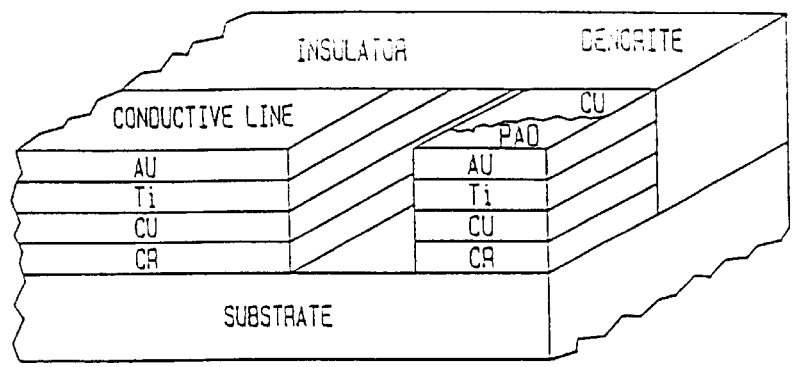
FIGS. 1a, 1b and 1c are sectional views (not to scale) of thin-film metal structures formed in accordance with prior art processes, and used here to explain the problem that applicants have identified.
Figure 4A:
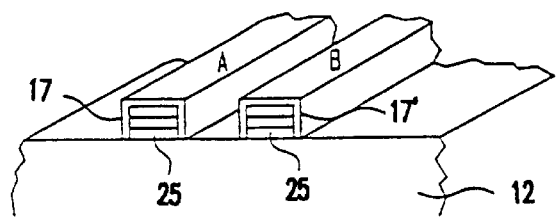
FIGS. 4a and 4b are sectional views, similar to those shown in FIG. 1a, but with thin-film metal structure in accordance with the teachings of this invention.
Figure 4B:
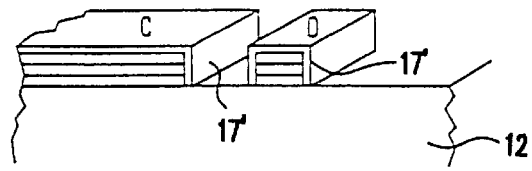

As will be readily apparent to those skilled in the microelectronics art, the process steps described in connection with FIG. 2 can be used to form multi-layer conductive line structures and multi-layer pad structures. FIG. 4a illustrates two adjacent line structures A and B, each with a multi-layer structure 25, such as Cr—Cu—Ti or Cr—Cu—Ni or Cr—Cu—Al, each encapsulated by a gold layer 17' deposited at an elevated substrate temperature in accordance with the invention. FIG. 4b shows a similar line-pad structure.

Figure 5:
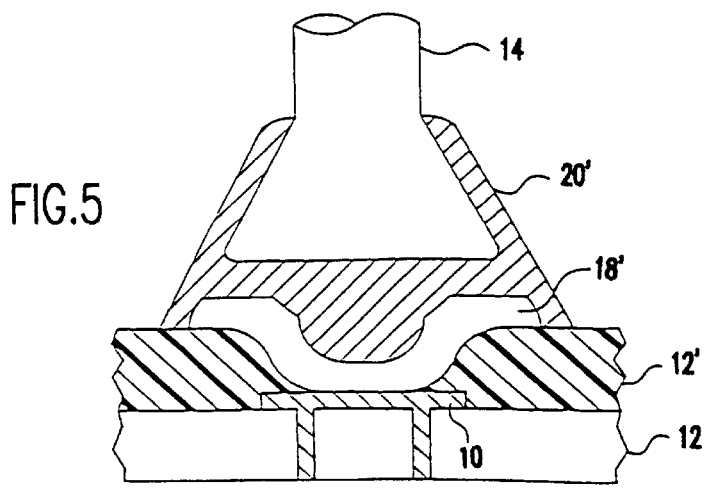
FIG. 5 is a sectional view similar to FIG. 1c but with a structure in accordance with the teaching of this invention.
Figure 1B:
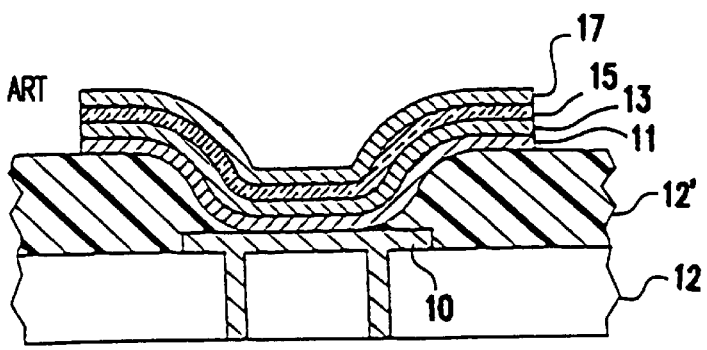
Figure 1C:
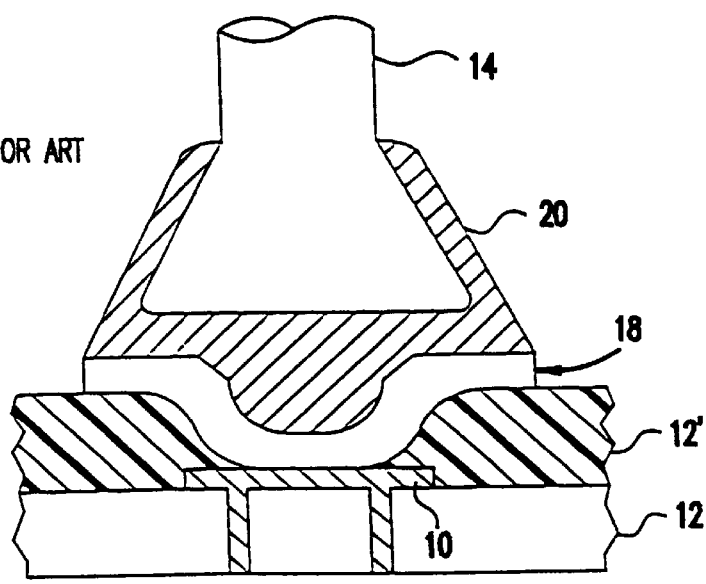

FIG. 5 shows a pin structure of the type shown in FIG. 1c, but with a gold layer formed at an elevated substrate temperature so that it encapsulates the underlying multi-layer structure. Here it should be noted when the pin 14 is brazed to the structure, the gold-tin brazing material 20' completely covers the edges of the structure as shown in FIG. 5, providing further edge protection to the gold covered structure 18'.

It will be appreciated that the invention is applicable to multi-layer metallic structures on substrates other than those specifically described. Other suitable materials for adhesion layer 11 are Ti, Zr, Nb, Mo, Ta, W, Hf, and V. Similarly, the second metal layer 15 could, in place of the copper layer discussed, be an aluminum layer or a layer of a copper alloy or aluminum alloy.

While the invention has been described in terms of a single preferred embodiment, those skilled in the art will recognize that the invention can be practiced with modification within the spirit and scope of the appended claims.

What is claimed is:

1. A corrosion resistant, multi-layer metal structure on a substrate, comprising in combination;
   an adhesion metallic layer formed on said substrate;
   a cushion metallic layer formed on said adhesion layer;
   a diffusion barrier layer formed on said cushion layer; and
   an impermeable gold layer that encapsulates said adhesion layer, said cushion layer and said diffusion barrier layer and spreading substantially evenly on sides of said adhesion layer, said cushion layer and said diffusion barrier layer and further contacting a region on said substrate adjacent said multi-layer metal structure to prevent oxidation and corrosion.

2. A corrosion resistant, multi-layer structure as in claim 1, wherein said multi-layer structure is a conductive line on said substrate.

3. A corrosion resistant, multi-layer structure as in claim 1, wherein said multi-layer structure is a conductive pad on said substrate.

4. A corrosion resistant, multi-layer structure as in claim 1, wherein said multi-layer structure is a pad for joining input/output pins to said substrate.

5. A corrosion resistant, multi-layer metal structure as in claim 1, wherein said adhesion layer is selected from the group consisting of Co, Ti, Zr, Nb, Mo, Ta, W, Hf, and V, and alloys of Co, Ti, Zr, Nb, Mo, Ta, W, Hf, and V.

6. A corrosion resistant, multi-layer metal structure on a substrate as in claim 5, wherein said cushion metallic layer is selected from the group consisting of Cu, Al, and alloys of Cu and Al.

7. A corrosion resistant, multi-layer metal structure on a substrate as in claim 6, wherein said diffusion barrier metallic layer is selected from the group consisting of Ti, Ni, Co, Pt, and Pd, and alloys of Ti, Ni, Co, Pt, and Pd.

8. A corrosion resistant, multi-layer metal structure on a substrate as in claim 1, wherein said cushion metallic layer is selected from the group consisting of Cu, Al, and alloys of Cu and Al.

9. A corrosion resistant, multi-layer metal structure on a substrate as in claim 1, wherein said diffusion barrier metallic layer is selected from the group consisting of Ti, Ni, Co, Pt, and Pd, and alloys of Ti, Ni, Co, Pt, and Pd.

10. A corrosion resistant, multi-layer metal structure on a substrate, comprising in combination;

an adhesion metallic layer formed on said substrate;

a cushion metallic layer formed on said adhesion layer; and an impermeable gold layer that encapsulates said adhesion layer and said cushion layer and spreading substantially evenly on sides of said adhesion layer and said cushion layer and further contacting a region on said substrate adjacent said multi-layer metal structure to prevent oxidation and corrosion.

11. A corrosion resistant, multi-layer metal structure on a substrate, comprising in combination;

an adhesion metallic layer formed on said substrate;

a cushion metallic layer formed on said adhesion layer;

a diffusion barrier layer formed on said cushion layer; and an impermeable gold layer that encapsulates said adhesion layer and said cushion layer and said diffusion barrier layer, said gold layer formed by a process of evaporation while said substrate is held at an elevated temperature causing said gold layer to spread substantially evenly on sides of said adhesion layer, said cushion layer and said diffusion barrier and further contacting a region on said substrate adjacent said multi-layer metal structure to prevent oxidation and corrosion.

12. A metal structure as recited in claim 11, wherein said elevated temperature is in a range of approximately 130° C. to 200° C.

13. A metal structure as recited in claim 11, wherein said gold layer is evaporated through a mask.

14. A corrosion resistant, multi-layer metal structure on a substrate formed by a process including the steps of depositing a first metallic layer through an opening in a mask onto a substrate, depositing a second metallic layer through said mask opening onto said first metallic layer, depositing gold through said mask opening to cover the first and second metallic layers, the gold layer being spread substantially evenly on sides of said first and second metallic layers and contacting a region on said substrate adjacent said first and second metallic layers to prevent oxidation and corrosion while maintaining said substrate at a temperature in a range between 130° C. and 200° C.

* * * * *